(12) United States Patent
Shiomi

(10) Patent No.: US 11,329,550 B2
(45) Date of Patent: May 10, 2022

(54) SNUBBER CIRCUIT AND POWER SUPPLY DEVICE

(71) Applicant: SHARP KABUSHIKI KAISHA, Sakai (JP)

(72) Inventor: Takeshi Shiomi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/225,537

(22) Filed: Apr. 8, 2021

(65) Prior Publication Data

US 2021/0320584 A1 Oct. 14, 2021

(30) Foreign Application Priority Data

Apr. 14, 2020 (JP) .............................. JP2020-072502

(51) Int. Cl.
*H02M 1/34* (2007.01)
*H03K 17/56* (2006.01)
*H02M 7/538* (2007.01)

(52) U.S. Cl.
CPC .............. *H02M 1/346* (2021.05); *H02M 1/34* (2013.01); *H02M 7/538* (2013.01); *H03K 17/56* (2013.01)

(58) Field of Classification Search
CPC .......... H02M 1/34; H02M 1/32; H02M 1/342; H02M 1/344; H02M 1/348; H02M 1/346; H02M 1/538; H03K 17/56

See application file for complete search history.

(56) References Cited

U.S. PATENT DOCUMENTS

| 9,531,252 B2* | 12/2016 | Yatsu ..................... H02M 7/538 |
| 10,224,808 B2* | 3/2019 | Torii ....................... H02M 1/14 |
| 10,505,440 B1* | 12/2019 | Lu ........................ H02M 3/1582 |
| 2009/0257255 A1* | 10/2009 | Zhang ................... H02M 3/335 |
| | | 363/50 |
| 2013/0188404 A1 | 7/2013 | Nakamura |
| 2016/0094118 A1* | 3/2016 | Yatsu ................ H02M 7/53871 |
| | | 363/56.03 |
| 2021/0288573 A1* | 9/2021 | Shiomi .................. H03K 17/56 |

FOREIGN PATENT DOCUMENTS

JP 2012039810 A 2/2012

* cited by examiner

*Primary Examiner* — Adolf D Berhane
(74) *Attorney, Agent, or Firm* — ScienBiziP, P.C.

(57) ABSTRACT

A snubber circuit connected to a switching circuit, wherein the switching circuit including a higher side switch element connected between a high potential node and a switch node, a lower side switch element connected between the switch node and a reference potential node, and a bypass capacitor connected between the high potential node and the reference potential node, the snubber circuit comprising: a snubber capacitor; a diode; and a coil, wherein a negative electrode of the snubber capacitor is connected to the reference potential node, an anode of the diode is connected to the switch node and a cathode of the diode is connected to a positive electrode of the snubber capacitor, and one end of the coil is connected to the positive electrode of the snubber capacitor and the other end of the coil is connected to the high potential node.

6 Claims, 5 Drawing Sheets

SNUBBER CIRCUIT AND POWER SUPPLY DEVICE

CROSS-REFERENCE TO RELATED APPLICATION

The present application claims priority from Japanese Application JP2020-072502, the content of which is hereby incorporated by reference into this application.

BACKGROUND

Field

The following disclosure relates to a snubber circuit.

The snubber circuit is added to suppress a surge voltage applied to a switch element. On the other hand, losses that occur in the snubber circuit are also problematic. JP 2012-39810 A discloses a discharge blocking snubber for reducing a loss in a snubber circuit.

SUMMARY

However, even with such a discharge blocking snubber, there is still room for loss reduction. One aspect of the present disclosure has an object to provide a snubber circuit capable of reducing a loss as compared to the related art.

In order to solve the above problem, a snubber circuit according to one aspect of the present disclosure is a snubber circuit connected to a switching circuit, the switching circuit being provided with a high potential node, a switch node, and a reference potential node, the switching circuit including a higher side switch element connected between the high potential node and the switch node, a lower side switch element connected between the switch node and the reference potential node, and a bypass capacitor connected between the high potential node and the reference potential node, the snubber circuit including a snubber capacitor, a diode, and a coil, wherein a negative electrode of the snubber capacitor is connected to the reference potential node, an anode of the diode is connected to the switch node and a cathode of the diode is connected to a positive electrode of the snubber capacitor, and one end of the coil is connected to the positive electrode of the snubber capacitor and the other end of the coil is connected to the high potential node.

Additionally, in order to solve the above problem, a snubber circuit according to one aspect of the present disclosure is a snubber circuit connected to a high potential node, a switch node, and a reference potential node, the snubber circuit including a snubber capacitor, a diode, and a coil, wherein a negative electrode of the snubber capacitor is connected to the reference potential node, an anode of the diode is connected to the switch node and a cathode of the diode is connected to a positive electrode of the snubber capacitor, and one end of the coil is connected to the positive electrode of the snubber capacitor and the other end of the coil is connected to the high potential node.

According to one aspect of the present disclosure, it is possible to reduce the loss in the snubber circuit as compared to the related art.

DESCRIPTION OF EMBODIMENTS

First Embodiment

Figure 1:
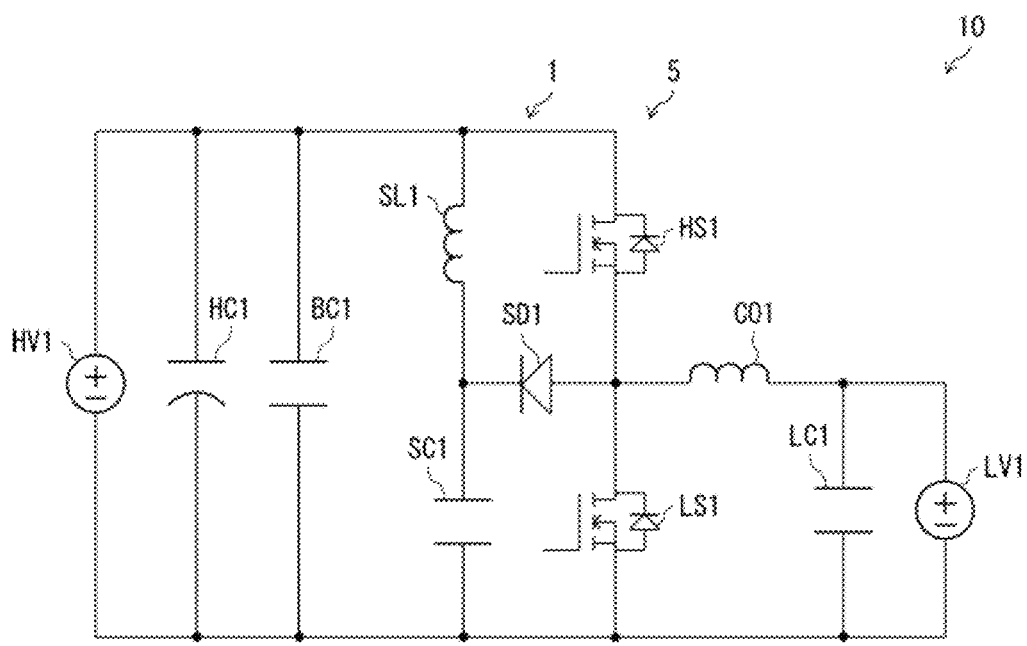
FIG. 1 is a diagram illustrating a snubber circuit and a power supply circuit according to a first embodiment.

A snubber circuit 1 according to a first embodiment suppresses a surge voltage generated in a power supply circuit 10 as well as suppresses losses generated in the snubber circuit 1. These contents are described below using FIG. 1 to FIG. 4. A configuration of the power supply circuit 10 will be described using FIG. 1. Operations of the power supply circuit 10 and snubber circuit 1 will be described using FIG. 2 to FIG. 4.

In each embodiment hereinafter, components having the same functions as those of components described in the first embodiment are denoted by the same reference signs, and descriptions thereof will not be repeated. For the sake of brevity, a "high-voltage power supply HV1" is also simply referred to as "HV1", for example. Also, note that each numerical value described below is merely an example.

Overview of Configuration of Power Supply Circuit 10

The power supply circuit 10 is a bidirectional DC-DC converter that can bidirectionally transmit electric power between a high-voltage power supply HV1 and a low-voltage power supply LV1. The power supply circuit 10 is provided with a switching circuit 5 and the snubber circuit 1. The snubber circuit 1 is connected to the switching circuit 5.

Configuration of High-Voltage Portion of Power Supply Circuit 10

A high-voltage portion is provided with HV1, a capacitor HC1, and a bypass capacitor BC1. HV1 has a voltage of 400 V on a positive electrode side, and a voltage of 0 V on a negative electrode side. An electrostatic capacitance of HC1 is 1 mF. BC1 is a film capacitor having an electrostatic capacitance of 1 µF. In the first embodiment, 0 V is set as a reference potential. The node of 0 V is referred to as a reference potential node. Further, a potential higher than the reference potential is referred to as a high potential. Then, a node having the high potential is referred to as a high potential node. The high potential described herein is, for example, a voltage of 10 V to 1200 V. A 400 V node determined by the voltage of HV1 is an example of the high potential node.

BC1 is located at a position closer to a switch portion described below than HC1. BC1 is connected between the high potential node and the reference potential node.

Configuration of Low-Voltage Portion of Power Supply Circuit 10

A low-voltage portion is provided with LV1, a capacitor LC1, and a coil CO1. LV1 has a voltage of 200 V on a positive (+) electrode side, and a voltage of 0 V on a negative (−) electrode side. An electrostatic capacitance of LC1 is 1 µF. An inductance of CO1 is 1 mH and an average current of CO1 is 12 A.

Configuration of Switch Portion of Power Supply Circuit 10

The switch portion has a half-bridge structure by a higher side switch element HS1 and a lower side switch element LS1. A connection point between HS1 and LS1 is a switch node. One end of CO1 is connected to the switch node. HS1 is connected between the high potential node and the switch node. LS1 is connected between the switch node and the reference potential node.

Gate terminals of HS1 and LS1 are connected to a control circuit 9 described later. A voltage at the switch node is switched between 400 V and 0 V by switching HS1 or LS1.

Both HS1 and LS1 are cascode GaN-HEMTs with a drain withstand voltage of 650 V and an on-resistance of 50 mΩ. In the example of FIG. 1, the circuit symbol of the MOSFET is used to represent the cascade GaN-HEMT. HS1 and LS1 may be replaced by other switch elements depending on the type of the power supply circuit. Note that the definition of the switch element herein is as follows.

"Switch element": An element capable of changing voltage of the switch node. Examples of switch element include a rectifying element, a transistor element, and a magnetic element (e.g., transformer winding and coil).

Configuration of Switch Circuit 5 of Power Supply Circuit 10

A configuration in which BC1 is added to the switch portion including HS1 and LS1 is the switching circuit 5.

Configuration of Snubber Circuit 1 of Power Supply Circuit 10

The snubber circuit 1 includes a snubber capacitor SC1, a diode SD1, and a coil SL1.

SC1 is a multilayer ceramic capacitor having a withstand voltage of 630 V and an electrostatic capacitance of 4.7 nF. A negative electrode of SC1 (lower side in FIG. 1) is connected to the reference potential node.

SD1 is a Fast Recovery Diode (FRD) having a withstand voltage of 600 V, a VF of 1 V at the start of conduction, and a resistance of 0.13Ω in a conductive state. An anode of SD1 is connected to the switch node. A cathode of SD1 is connected to a positive electrode of SC1 (upper side in FIG. 1).

SL1 is a chip coil having an inductance of 470 nH and a resistance of 70 mΩ. One end of SL1 is connected to the positive electrode of SC1. The other end of SL1 is connected to the high potential node.

Description of Operation of Power Supply Circuit 10

The power supply circuit 10 operates in the same manner as a general bidirectional DC/DC converter. Power is transferred bi-directionally by controlling on and off of HS1 or LS1. When LS1 is turned off, a surge voltage is generated between the reference potential node and the switch node. In other words, a surge voltage is generated at LS1.

The operation of the snubber circuit 1 will be described using FIG. 2 to FIG. 4.

Figure 2:
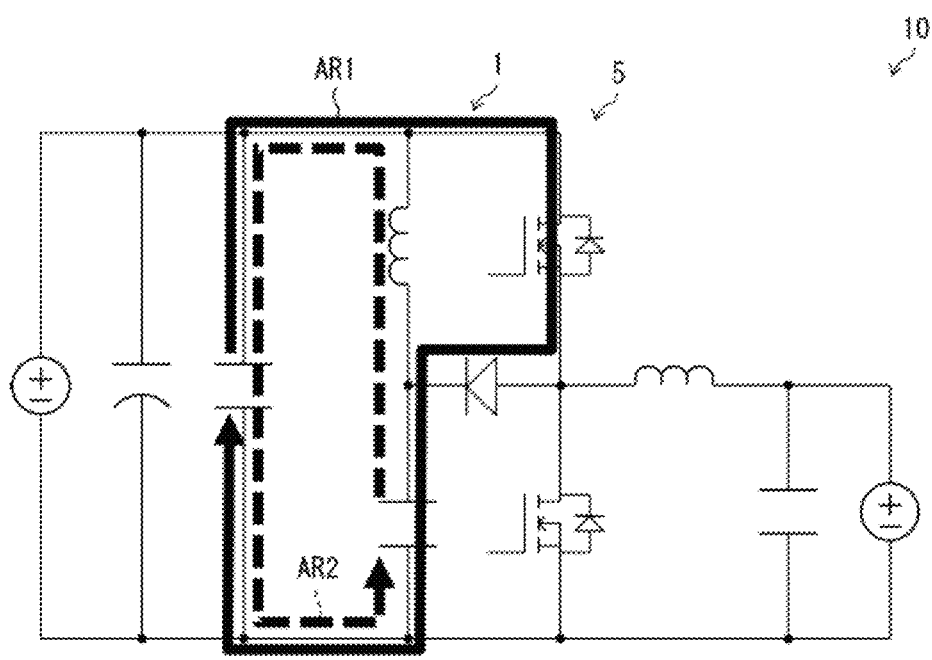
FIG. 2 is a diagram illustrating current paths in the snubber circuit.

FIG. 2 is a diagram illustrating current paths in the snubber circuit 1 in FIG. 1. In FIG. 2, the same circuit diagram as in FIG. 1 is illustrated, but some reference signs used in FIG. 1 are omitted.

Figure 3:
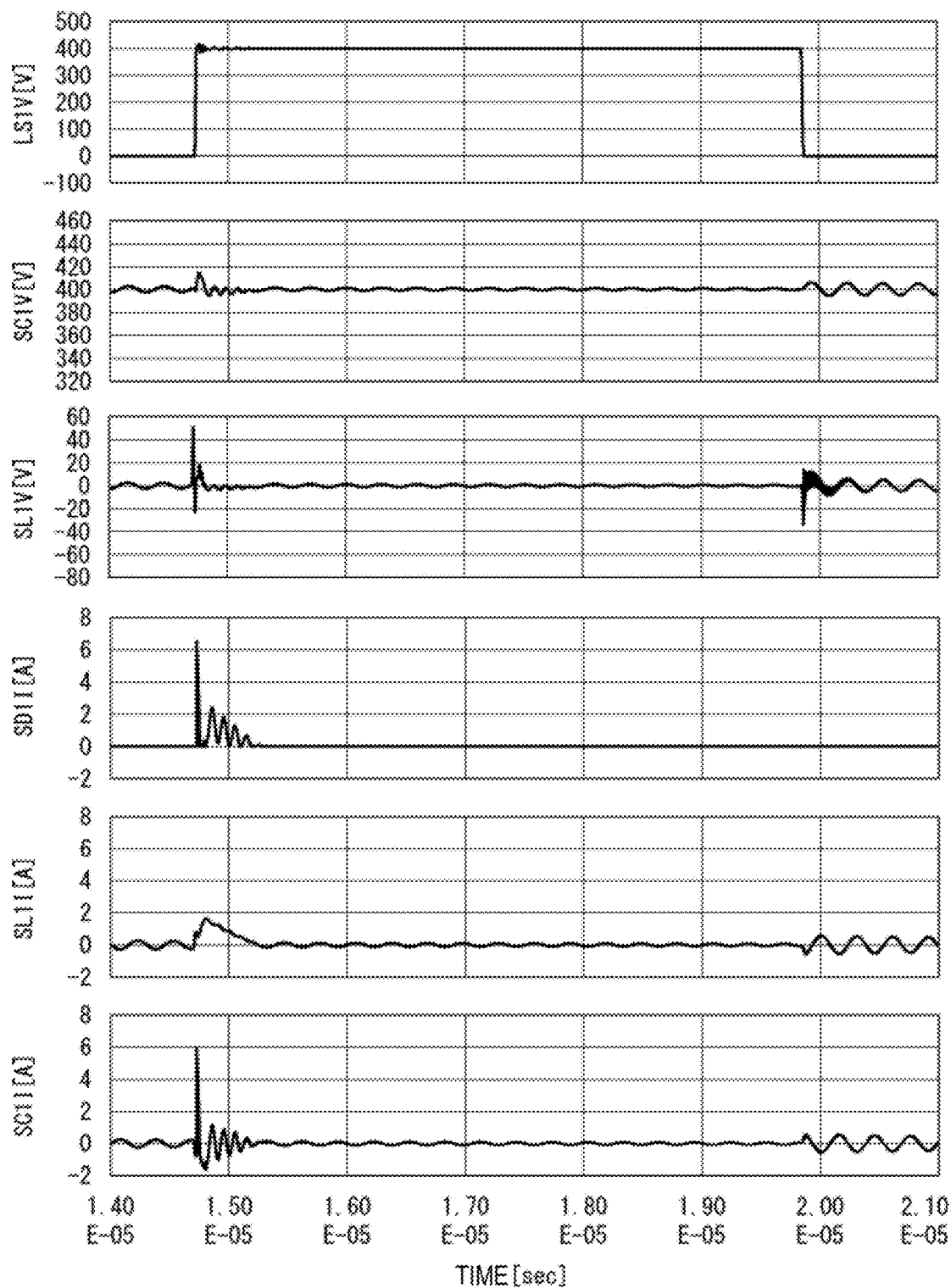
FIG. 3 is a diagram illustrating an operation waveform of each portion of the snubber circuit.

FIG. 3 illustrates a waveform of each portion of the snubber circuit 1 based on a common time axis (horizontal axis). Each waveform in FIG. 3 illustrates:

LS1V (voltage of LS1): voltage of the switch node with reference to the reference potential node;

SC1V (voltage of SC1): a voltage of the positive electrode with reference to the negative electrode;

SL1V (voltage of SL1): a terminal voltage on the SC1 side with reference to a terminal on the high potential node side;

SD1I (current of SD1): a current flowing from the anode to the cathode;

SL1I (current of SL1): a current flowing from the terminal on the SC1 side to the terminal on the high potential node side; and SC1I (current of SC1): a current flowing from positive electrode to negative electrode.

Figure 4:
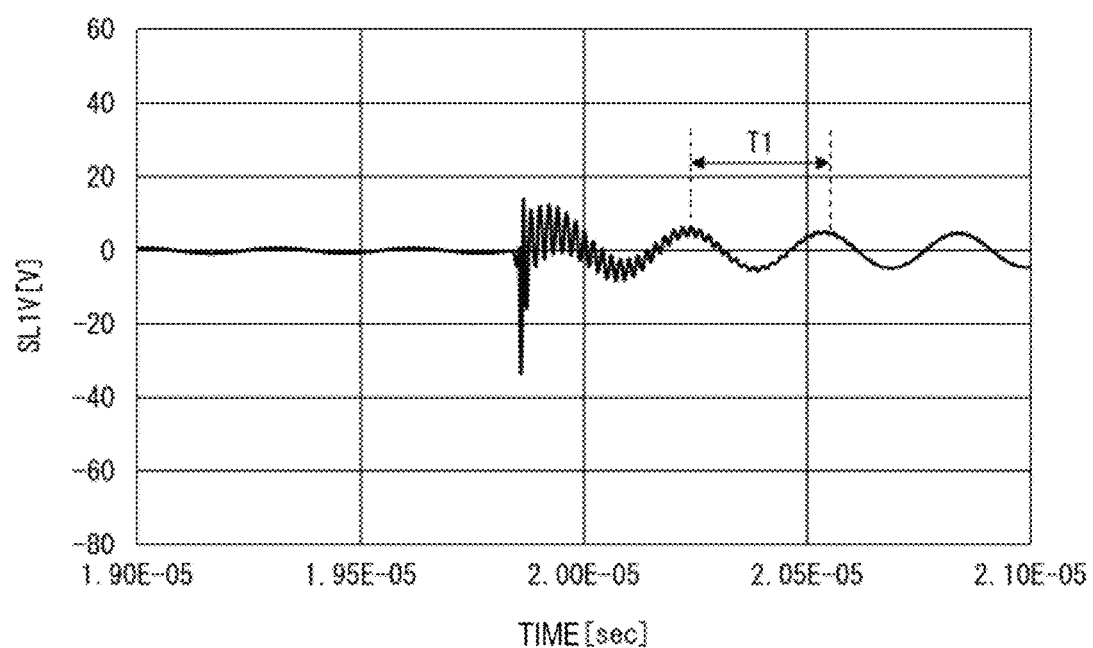
FIG. 4 is a diagram illustrating a voltage waveform of a coil of the snubber circuit.

FIG. 4 is an enlarged view of SL1V in FIG. 3.

Method of Operating Snubber Circuit 1

In the operation of the snubber circuit 1, following three processes are executed in this order.

First process: generate a surge voltage between the reference potential node and the switch node;

Second process: charge the surge voltage to SC1 via SD1;

Third process: the voltage of SC1 charged is discharged to the high potential node via SL1.

First Process: Generate Surge Voltage

In the first process, LS1 is switched from on to off. A timing of the switch is a point in time of "1.47 E-5 sec" in FIG. 3. This switch generates a surge voltage at the switch node based on the reference potential node. In a case that the snubber circuit 1 is not connected to the power supply circuit 10, a surge voltage 480 V is generated with respect to a steady voltage 400 V (not illustrated). In the first embodiment, the surge voltage is suppressed to 410 V because the snubber circuit 1 is connected to the power supply circuit 10 (see LS1V in FIG. 3).

Second Process: Charge Surge Voltage to SC1

The reduced surge voltage (480 V−410 V=70 V) as described above is absorbed into SC1 via SD1. In other words, the surge voltage charges SC1. A timing of the charging is immediately after (approximately at the same time as) the first process. A timing of the charging is a point in time of "1.475 E-5 sec" in FIG. 3. Flow of SD1I and SC1I, and an increase in SC1V (charge of SC1) can be confirmed.

A charging path for SC1 is illustrated by an arrow AR1 in FIG. 2. AR1 includes a path to return to BC1 from BC1 via HS1, SD1, and SC1.

Third Process: Discharge Voltage of SC1 to High Potential Node

The charged voltage of SC1 changes from a steady state (400 V) to 410 V (see SC1V in FIG. 3). A timing of the discharge start of SC1 is a point in time of "1.48 E-5 sec" in FIG. 3. The voltage of SC1 is slowly discharged to the high potential node by SL1 over a period of "1.48 E-5 to 1.53 E-5 sec." In the case of the power supply circuit 10, the voltage of SC1 charges BC1 connected to the high potential node.

A discharging path for SC1 is illustrated by an arrow AR2 in FIG. 2. AR2 includes a path to return to SC1 from SC1 via SL1 and BC1.

The discharge current of SC1 is smoothed by SL1 to slowly charge BC1. Thus, loss of the snubber circuit 1 can be reduced.

Improvements 1 and 2 for Operating Snubber Circuit 1

In the first embodiment, a plurality of preferred improvements are applied. These preferred improvements will be described below.

Improvement 1: Inductance of Discharging Path of SC1 is Greater than Inductance of Charging Path of SC1

In the example of the first embodiment, the inductance of the path AR1 (hereinafter, referred to as L1) is designed to be as small as 50 nH. For this reason, the surge voltage is rapidly absorbed by SC1, and thus, can be effectively suppressed. On the other hand, the inductance of the path AR2 (hereinafter, referred to as L2) is designed to be large as much as 500 nH. For this reason, the discharge of SC1 is performed gently, and thus, the loss can be reduced. Designing L2 to be large and L1 to be small leads to both the suppressed surge voltage and the reduced loss of the snubber circuit. Specifically, L2 is preferably two times L1 or more, and more preferably 10 times or more. In the first embodiment, L2 is designed to be 10 times L1.

Improvement 2: Resonance Frequency of SL1V by Turning on LS1 is 10 MHz or Less

Here, a problem of the surge voltage of SL1 rather than LS1 is picked up.

When LS1 is turned on (point in time of "1.99 E-5 sec" in FIG. 4), a resonance is generated in SL1V due to a surge voltage being applied to SL1. This phenomenon causes a loss in SL1 of the snubber circuit 1. In the improvement 2, loss reduction due to the voltage resonance of SL1 is performed.

FIG. 4 is a graph of SL1V with the time axis in FIG. 3 being enlarged. A period T1 in FIG. 4 indicates a period 3.00 E-7 sec of a voltage amplitude of SL1V. In other words, the resonance frequency of SL1V is 3.3 MHz.

Note that the "resonance frequency" of SL1V herein refers to a frequency (3.3 MHz) of a component that indicates the highest voltage amplitude at the period T1 among the frequency components included in SL1V. In the example of FIG. 4, a high frequency component (e.g., a component of 50 MHz) included in the period T1 has a small voltage amplitude. Thus, 50 MHz is not applicable to the definition of the resonance frequency herein.

The frequency component of SL1V indicating the highest voltage amplitude has a large effect, on the loss of SL1. Thus, reducing the resonance frequency defined as above is effective for reducing the SL1 loss.

By suppressing the resonance frequency to 10 MHz or less, the SL1 loss (core loss and eddy current loss) can be reduced. By setting the resonance frequency to be 10 MHz or less, a small coil using ferrite can be used. The resonance frequency is determined by the inductance of AR2 and the electrostatic capacitance of SC1. By appropriately adjusting these two values, the resonance frequency can be set to 10 MHz or less.

Second Embodiment

Figure 5:
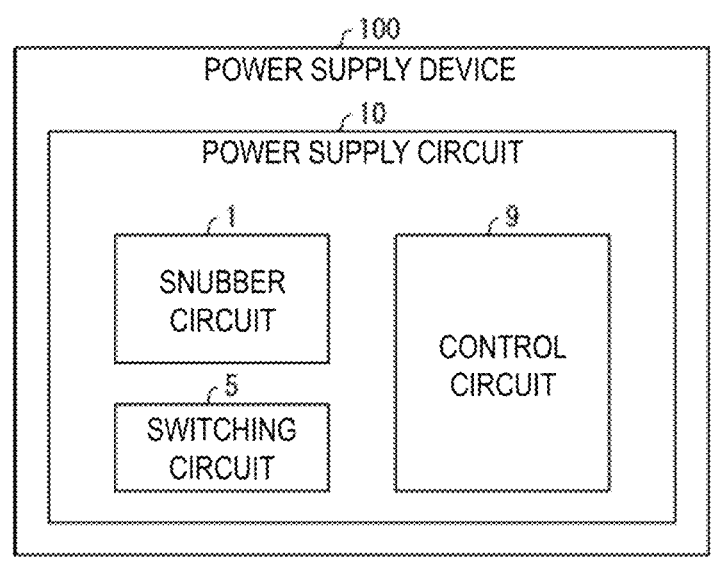
FIG. 5 is a diagram illustrating a power supply device according to a second embodiment.

FIG. 5 is a diagram illustrating a power supply device 100 provided with the power supply circuit 10. The power supply circuit 10 is provided with the snubber circuit 1, the switching circuit 5, and the control circuit 9. The control circuit 9 controls ON/OFF switching of the elements provided in the power supply circuit 10. In particular, the control circuit 9 controls the ON/OFF switching of HS1 and LS1. Application examples of the power supply circuit 10 include inverter circuits and totem-pole power factor correction (PFC) circuits. The power supply device 100 suppresses the surge voltage by the snubber circuit 1 and also reduces the losses.

Supplement

A snubber circuit according to a first aspect of the present disclosure is a snubber circuit connected to a switching circuit, the switching circuit being provided with a high potential node, a switch node, and a reference potential node, the switching circuit including a higher side switch element connected between the high potential node and the switch node, a lower side switch element connected between the switch node and the reference potential node, and a bypass capacitor connected between the high potential node and the reference potential node, the snubber circuit including a snubber capacitor, a diode, and a coil, wherein a negative electrode of the snubber capacitor is connected to the reference potential node, an anode of the diode is connected to the switch node and a cathode of the diode is connected to a positive electrode of the snubber capacitor, and one end of the coil is connected to the positive electrode of the snubber capacitor and the other end of the coil is connected to the high potential node.

According to the above configuration, the surge voltage generated in the lower side switch element charges the snubber capacitor. The snubber capacitor is charged in a path including the bypass capacitor, the higher side switch element, and the diode. This charged voltage is smoothed by the coil and is used for regeneration for the bypass capacitor (slowly charging the bypass capacitor). Thus, the loss of the snubber circuit can be reduced.

In the snubber circuit according a second aspect of the present disclosure, an inductance of a path including the snubber capacitor, the coil, and the bypass capacitor is larger than inductance of a path including the bypass capacitor, the higher side switch element, the diode, and the snubber capacitor.

According to the above configuration, the surge voltage can charge the snubber capacitor at high speed in the path having the smaller inductance. That is, the surge voltage can be quickly absorbed by the snubber capacitor. The voltage of the snubber capacitor charged by absorption of the surge voltage can be smoothed by a large inductance and be used for slow regeneration for the bypass capacitor.

In the snubber circuit according to a third aspect of the present disclosure, after the lower side switch element is turned on, a resonance frequency of a voltage applied to the coil is 10 MHz or less.

According to the above configuration, the loss occurring in the coil can be reduced.

A power supply device according to a fourth aspect of the present disclosure includes the snubber circuit according to one aspect of the present disclosure.

According to the above configuration, a power supply device with reduced loss can be provided by using the snubber circuit with reduced loss.

A snubber circuit according to a fifth aspect of the present disclosure is a snubber circuit connected to a high potential node, a switch node, and a reference potential node, the snubber circuit including a snubber capacitor, a diode, and a coil, wherein a negative electrode of the snubber capacitor is connected to the reference potential node, an anode of the diode is connected to the switch node and a cathode of the diode is connected to a positive electrode of the snubber capacitor, and one end of the coil is connected to the positive electrode of the snubber capacitor and the other end of the coil is connected to the high potential node.

According to the above configuration, the surge voltage generated between the high potential node and the switch node is absorbed by the snubber capacitor via the diode (the snubber capacitor is charged). This charged voltage is smoothed using the coil and slowly discharged to the high potential node. Thus, the loss of the snubber circuit can be reduced.

SUPPLEMENTARY INFORMATION

An aspect of the present disclosure is not limited to each of the embodiments described above. It is possible to make various modifications within the scope indicated in the claims. An embodiment obtained by appropriately combining technical elements each disclosed in different embodiments falls also within the technical scope of an aspect of the present disclosure. Furthermore, technical elements disclosed in the respective embodiments may be combined to provide a new technical feature.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A snubber circuit connected to a switching circuit, the switching circuit being provided with a high potential node, a switch node, and a reference potential node,
   the switching circuit including
   a higher side switch element connected between the high potential node and the switch node,
   a lower side switch element connected between the switch node and the reference potential node, and
   a bypass capacitor connected between the high potential node and the reference potential node,
   the snubber circuit comprising:
   a snubber capacitor;
   a diode; and
   a coil,
   wherein a negative electrode of the snubber capacitor is connected to the reference potential node,
   an anode of the diode is connected to the switch node and a cathode of the diode is connected to a positive electrode of the snubber capacitor, and
   one end of the coil is connected to the positive electrode of the snubber capacitor and the other end of the coil is connected to the high potential node.

2. The snubber circuit according to claim 1, wherein an inductance of a path including the snubber capacitor, the coil, and the bypass capacitor is larger than an inductance of a path including the bypass capacitor, the higher side switch element, the diode, and the snubber capacitor.

3. The snubber circuit according to claim 1, wherein after the lower side switch element is turned on, a resonance frequency of a voltage applied to the coil is 10 MHz or less.

4. The snubber circuit according to claim 2, wherein after the lower side switch element is turned on, a resonance frequency of a voltage applied to the coil is 10 MHz or less.

5. A power supply device comprising:
   the snubber circuit according to claim 1.

6. A snubber circuit connected to a high potential node, a switch node, and a reference potential node, the snubber circuit comprising:
   a snubber capacitor;
   a diode; and
   a coil,
   wherein a negative electrode of the snubber capacitor is connected to the reference potential node,
   an anode of the diode is connected to the switch node and a cathode of the diode is connected to a positive electrode of the snubber capacitor, and
   one end of the coil is connected to the positive electrode of the snubber capacitor and the other end of the coil is connected to the high potential node.

* * * * *